United States Patent
Ananthanarayanan et al.

(10) Patent No.: US 7,256,617 B2
(45) Date of Patent: Aug. 14, 2007

(54) METHOD AND APPARATUS TO LINEARIZE OUTPUT BUFFER AND ON-CHIP TERMINATION

(75) Inventors: Priya Ananthanarayanan, Cupertino, CA (US); Samudyatha Suryanarayana, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 880 days.

(21) Appl. No.: 10/387,723

(22) Filed: Mar. 13, 2003

(65) Prior Publication Data

US 2004/0178823 A1    Sep. 16, 2004

(51) Int. Cl.
*H03K 19/094* (2006.01)
(52) U.S. Cl. ............... 326/87; 326/86; 326/113; 327/109; 327/333
(58) Field of Classification Search ........... 326/82–83, 326/86–87, 112–113; 327/108–109, 333
See application file for complete search history.

(56) References Cited

U.S. PATENT DOCUMENTS

| | | | |
|---|---|---|---|
| 6,177,819 B1 * | 1/2001 | Nguyen | 327/112 |
| 6,351,148 B1 * | 2/2002 | Lee | 326/86 |
| 6,441,653 B1 * | 8/2002 | Spurlin | 327/108 |
| 6,483,349 B2 * | 11/2002 | Sakata et al. | 326/83 |
| 6,646,488 B2 * | 11/2003 | Ajit | 327/262 |

\* cited by examiner

*Primary Examiner*—Rexford Barnie
*Assistant Examiner*—Jason Crawford
(74) *Attorney, Agent, or Firm*—Osha-Liang LLP

(57) ABSTRACT

A driver circuit that outputs a data signal uses feedback of the data signal to the driver circuit to modulate a drive strength of the driver circuit. The driver circuit has a pull-up driver stage and a pull-down driver stage. The pull-up driver stage uses a pull-up control circuit to modulate a drive strength of the pull-up driver stage dependent on a voltage of the data signal. The pull-down driver stage uses a pull-down control circuit to modulate a drive strength of the pull-down driver stage dependent on the voltage of the data signal.

13 Claims, 4 Drawing Sheets

METHOD AND APPARATUS TO LINEARIZE OUTPUT BUFFER AND ON-CHIP TERMINATION

BACKGROUND OF INVENTION

As shown in FIG. 1, a typical computer system 10 has, among other components, a microprocessor 12, one or more forms of memory 14, integrated-circuits 16 having specific functionalities, and peripheral computer resources (not shown), e.g., monitor, keyboard, software programs, etc. These components communicate with one another via communication paths 18, e.g., wires, buses, etc., to accomplish the various tasks of the computer system 10.

When an integrated circuit (16 in FIG. 1) communicates with another integrated circuit, i.e., "chip-to-chip communication," data is transmitted in a series of binary 0's and 1's from a transmitting circuit to a receiving circuit. Accordingly, at any particular time, a data signal received at the receiving circuit may have a low voltage potential representative of a binary '0' or a high voltage potential representative of a binary '1.'

More specifically, in data transmission or "chip-to-chip communication," a transmitting circuit drives a data bit into a printed circuit board (PCB) trace or data channel using specific voltage levels. As referenced to above, a binary '1' is represented by any voltage above a particular voltage value, and a binary '0' is represented by any voltage below a particular voltage value. Accordingly, when driving a '1,' a driver circuit in the transmitting circuit places, or "launches," a voltage step on the PCB trace.

FIG. 2 shows a portion of a typical chip-to-chip communication system 20. The chip-to-chip communication system 20 includes in part a transmitting circuit 22 and a receiving circuit 24. The transmitting circuit 22, using a driver stage (also referred to as "output buffer") formed by a pull-up transistor 26 and a pull-down transistor 28, is arranged to drive a data signal 40 into a data channel (or PCB trace) 30 which, in turn, propagates the data signal 40 to a receiver 32 in the receiving circuit 24. The inputs to the pull-up transistor 26 and the pull-down transistor 28 are respectively controlled by buffers 34 and 36, which are controlled by some logic 38 in the transmitting circuit 22. Those skilled in the art will understand that the inputs to the pull-up transistor 26 and the pull-down transistor 28 are controlled separately in order to control, among other things, crow bar currents and voltage swing levels of the data signal 40.

The maximum frequency of a particular chip-to-chip communication system is a function not only of the time that it takes for a data bit to propagate from a transmitting circuit (e.g., 22 in FIG. 2) to a receiving circuit (e.g., 24 in FIG. 2), but also of the time required for the data bit on a signal to settle to a level that can be reliably recognized by the receiving circuit (e.g., 24 in FIG. 2) as being 'high' or 'low.' Such settling time of a data signal is dependent on many factors including, but not limited to, a slew rate or edge rate of the data signal launched by the transmitting circuit (e.g., 24 in FIG. 2), oscillations in the voltage level of the data signal resulting from the effects of package inductance, pad capacitance, other parasitics, etc., ringing due to reflections from impedance mismatches within the chip-to-chip communication system, the voltage level of the launched data signal relative to the overall voltage swing of the data signal, and the effectiveness of the terminations at both ends of the data channel between the transmitting and receiving circuits.

SUMMARY OF INVENTION

According to one aspect of the present invention, a communication system comprises a pull-up driver portion arranged to generate a first transition on a data signal, where the pull-up driver portion comprises at least one pull-up device operatively connected to the data signal and pull-up control circuitry arranged to modulate a drive strength of the pull-up device dependent on a feedback of the data signal to the pull-up control circuitry; and a pull-down driver portion arranged to generate a first transition on the data signal, where the pull-down driver portion comprises at least one pull-down device operatively connected to the data signal and pull-down control circuitry arranged to modulate a drive strength of the pull-down device dependent on a feedback of the data signal to the pull-down control circuitry.

According to another aspect, a method for handling a data signal comprises: receiving data; and, when the data represents a logic high, pulling up a voltage of the data signal, where the pulling up comprises feeding back the data signal and modulating the pulling up dependent on the feeding back; and, when the data represents a logic low, pulling down the voltage of the data signal, where the pulling down comprises feeding back the data signal and modulating the pulling down dependent on the feeding back.

According to another aspect, a communication system comprises: means for receiving input data; means for pulling up a voltage of a data signal when the input data is a logic high, where the means for pulling up comprises first control means for controlling a drive strength of the means for pulling up dependent on a feedback of the data signal to the first control means; and means for pulling down the voltage of the data signal when the input data is a logic low, where the means for pulling down comprises second control means for controlling a drive strength of the means for pulling down dependent on a feedback of the data signal to the second control means.

Other aspects and advantages of the invention will be apparent from the following description and the appended claims.

DETAILED DESCRIPTION

Ideally, the impedance of a driver circuit in a transmitting circuit (e.g., 22 in FIG. 2) or at an input termination in a receiving circuit (e.g., 24 in FIG. 2) should be constant with minimal variation across the voltage swing of a signal driven into the data channel. In other words, the current-voltage, or I-V, curve of the driver circuit should be linear across the output voltage swing in order to terminate reflections (receipt of the signal at the terminal of the data channel) at a receiving circuit (e.g., 24 in FIG. 2) effectively, thereby decreasing signal settling time and enhancing signal integrity.

Figure 1:
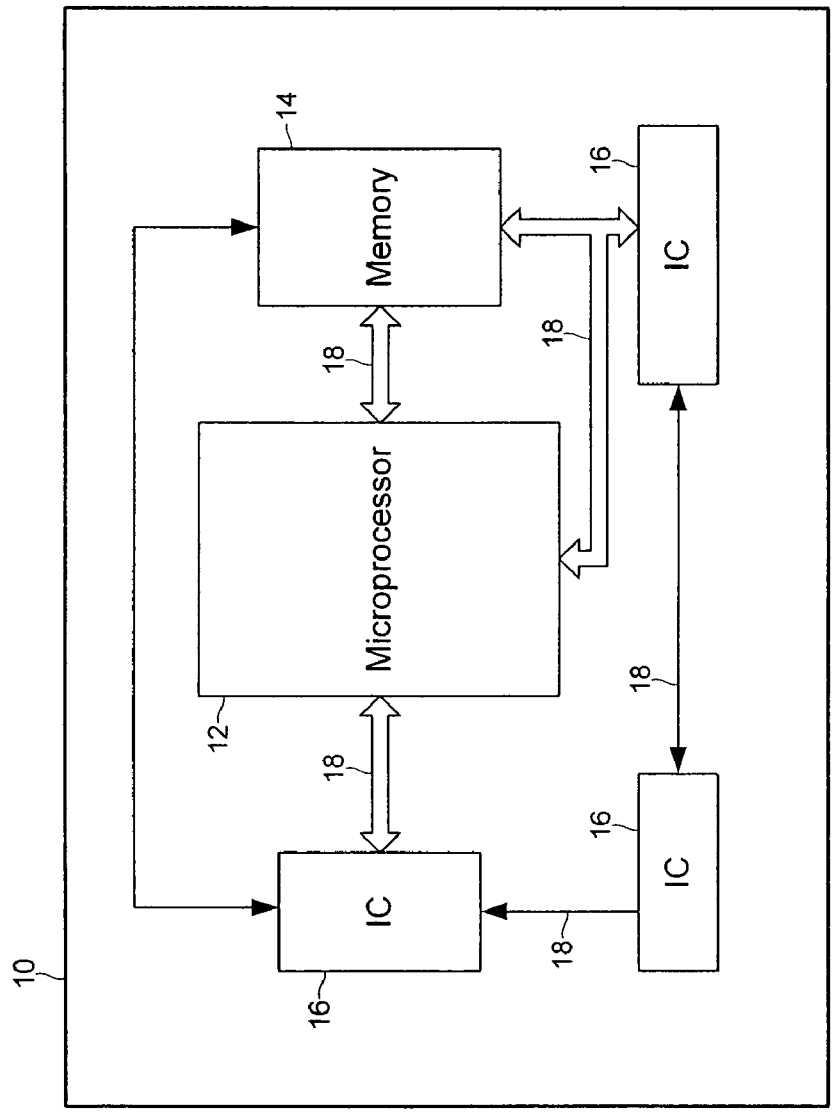
FIG. 1 shows a typical computer system.
Figure 2:
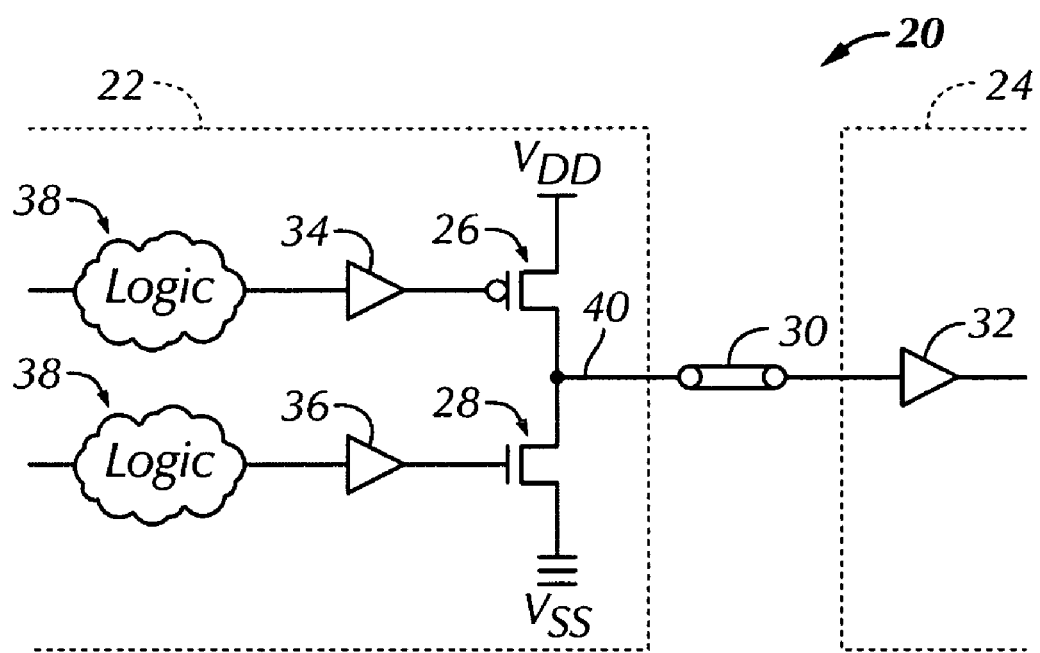
FIG. 2 shows a portion of a typical chip-to-chip communication system.

With respect to the driver stage formed by the pull-up transistor 26 and the pull-down transistor 28 in the portion of the chip-to-chip communication system 20 shown in FIG. 2, the I-V relationship of the transistors 26 and 28 follows the typical CMOS characteristic curve, which is highly nonlinear across the range of voltages applied to the terminals of the transistors 26 and 28, particularly the drain-to-source voltages. Still referring to FIG. 2, during the course of a voltage transition on the data signal 40, as one of the transistors 26 and 28 is activated, the activated transistor moves from a saturation mode of operation to a linear region of operation. This change in current through the activated transistor is not proportional to the change in the drain-to-source voltage of the active transistor 26 or 28 and effectively leads to impedance fluctuations that affect the integrity of the data signal 40, which, in turn, leads to uncertainty in data window reception.

Figure 3:
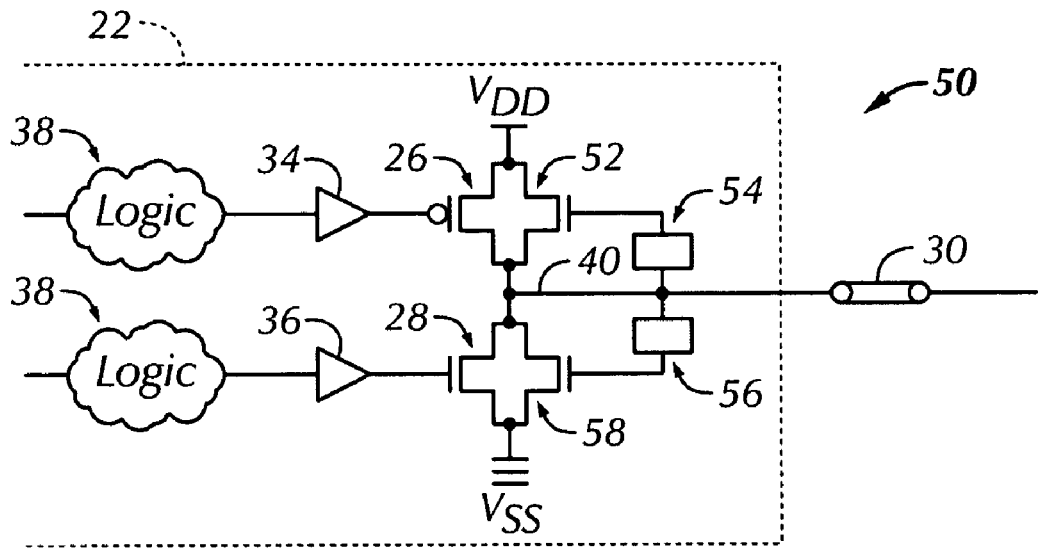
FIG. 3 shows a portion of a typical chip-to-chip communication system.

In attempting to combat such impedance variability, additional circuitry has been used in the driver stage. To this end, FIG. 3 shows a portion of another typical chip-to-chip communication system 50. In the chip-to-chip communication system 50 shown in FIG. 3, a diode-connected transistor 52 is positioned in parallel with the 'normally connected' pull-up transistor 26 and another diode-connected transistor 58 is positioned in parallel with the 'normally connected' pull-down transistor 28. Those skilled in the art will understand that transistors 52 and 54 are said to be 'diode-connected' because the gate and drain terminals of the transistors 52 and 54 are connected together. As arranged in FIG. 3, the normally connected pull-up transistor 26 and pull-down transistor 28 follow the characteristic CMOS I-V curve, and the diode-connected transistors 52 and 54 follow a transconductance curve. Moreover, the driver stage in FIG. 3 includes switching circuitry 54 and 56 that selectively control the gates or inputs of the diode-connected transistors 52 and 54, respectively.

The low current flow through the normally connected pull-up transistor 26 during the first part of a transition from 'low' to 'high' on the data signal 40 (due to the gate of the transistor 26 being connected to the transitioning data signal 40) is compensated by the diode-connected transistor 52 because the diode-connected transistor 52, via the switching circuitry 54, is arranged to fully switch 'on,' i.e., fully conduct current, when the transition from 'low' to 'high' begins. However, this arrangement of the normally connected pull-up transistor 26 and the diode-connected transistor 52 linearizes the I-V curve of the driver stage only during the first part of the transition from 'low' to 'high,' in which the diode-connected transistor 52 supplements current as the normally connected pull-up transistor 26 traverses through the saturation region of operation. Moreover, because the change in current through transistor 26 is not proportional to the change in voltage, further non-linearity occurs throughout the transition of the data signal 40. When the data signal 40 voltage rises to a threshold below a particular voltage (i.e., $V_{DD}$), the diode-connected transistor 52 switches 'off' and becomes unable to supplement or compensate current as it did during the first part of the transition from 'low' to 'high.'

Similarly, the low current flow through the normally connected pull-up transistor 28 during the first part of a transition from 'high' to 'low' on the data signal 40 is compensated by the diode-connected transistor 58 because the diode-connected transistor 58 is arranged to fully switch 'on' when the transition from 'high' to 'low' begins. However, this arrangement of the normally connected pull-down transistor 28 and the diode-connected transistor 58 linearizes the I-V curve of the driver stage only during the first part of the transition from 'high' to 'low,' in which the diode-connected transistor 58 supplements current as the normally connected pull-down transistor 28 traverses through the saturation region of operation. Moreover, because the change in current through transistor 28 is not proportional to the change in voltage, further non-linearity occurs throughout the transition of the data signal 40. When the data signal 40 voltage falls to a threshold above a particular voltage (i.e., $V_{SS}$), the diode-connected transistor 58 switches 'off' and becomes unable to supplement or compensate current as it did during the first part of the transition from 'high' to 'low.' Accordingly, during the course of a transition from either 'low' to 'high' or 'high' to 'low' on the data signal 40, the diode-connected transistors 52 and 58 are not active for some amount of the transition time, and further because the change in current is not proportional to the change in voltage, are therefore not able to supplement current to linearize the I-V behavior of the driver stage across a signal transition.

Embodiments of the present invention relate to a driver stage for a chip-to-chip communication system that linearizes the I-V behavior of the driver stage across a signal transition. Embodiments of the present invention further relate to a driver circuit design that uses feedback from an output signal to modulate pull-up and pull-down devices in the driver circuit. Embodiments of the present invention further relate to a technique for reducing impedance variability at an input termination of a receiver circuit.

Figure 4:
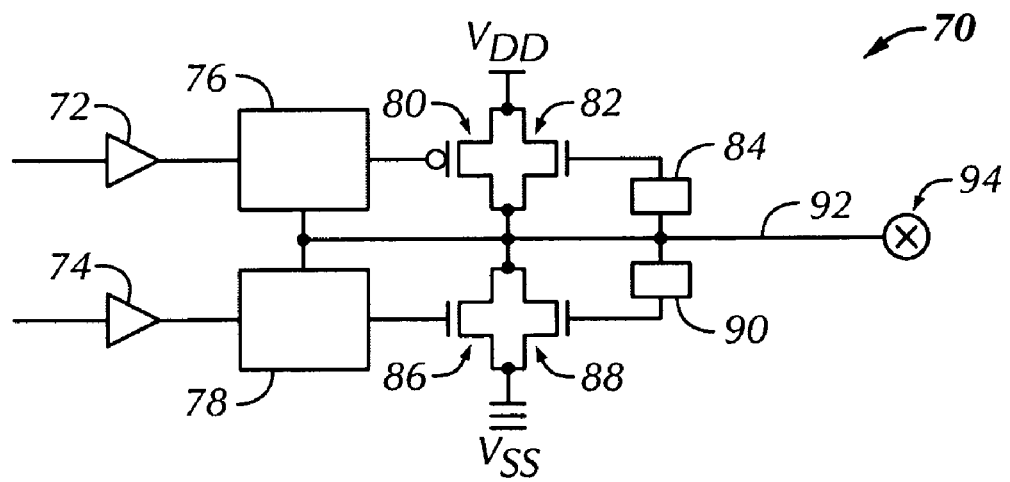
FIG. 4 shows a portion of a chip-to-chip communication system in accordance with an embodiment of the present invention.

FIG. 4 shows a portion of an exemplary chip-to-chip communication system 70 in accordance with an embodiment of the present invention. In FIG. 4, a driver stage comprises a pull-up driver stage and a pull-down driver stage. In one embodiments (as shown in FIG. 4), the pull-up driver stage comprises a pull-up control unit 76, a 'normally connected' pull-up transistor 80, a diode-connected transistor 82, and switching circuitry 84 and the pull-down driver stage comprises a pull-down control unit 78, a 'normally connected' pull-down transistor 86, a diode-connected transistor 88, and switching circuitry 90.

As shown in FIG. 4, the driver stage outputs data, in the form of voltage levels, to a data signal 92 that is propagated to some data channel 94 for further propagation to a receiving circuit (not shown). The data signal 92 also serves as feedback to the pull-up control unit 76 and the pull-down control unit 78, which respectively input data from buffers/drivers 72 and 74 and respectively control the gates, or inputs, of pull-up transistor 80 and pull-down transistor 86. The pull-up control unit 76 and the pull-down control unit 78 are described in detail below with reference to FIGS. 5 and 6.

Figure 5:
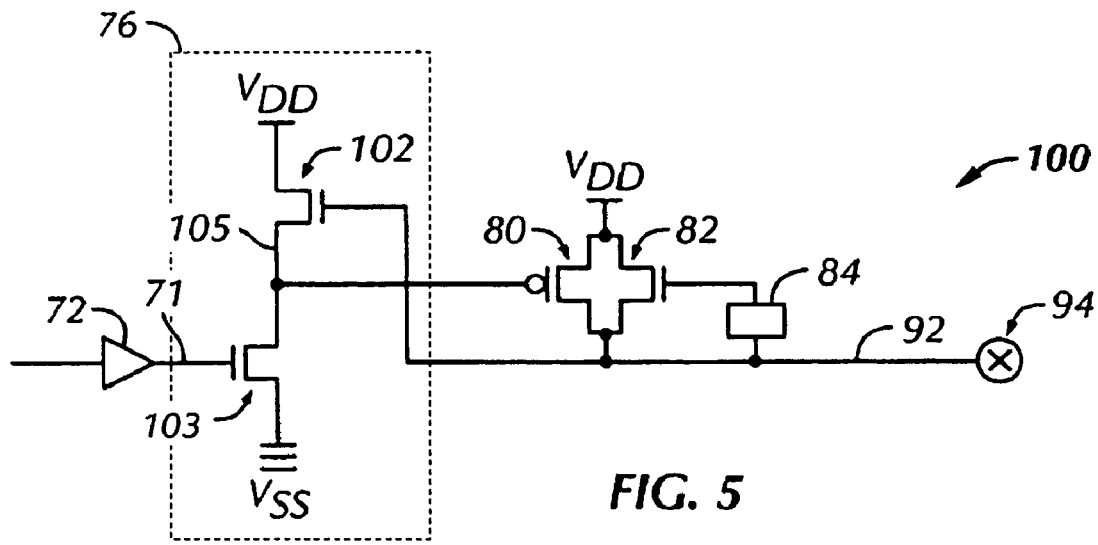
FIG. 5 shows a portion of a driver stage of the chip-to-chip communication system shown in FIG. 4.

FIG. 5 shows an exemplary pull-up stage 100 of the driver stage of the portion of the chip-to-chip communication system 70 shown in FIG. 4. The pull-up stage 100 includes transistor 102 and transistor 103, which are connected in series at a terminal 105 that is connected to the gate of normally connected pull-up transistor 80. Transistor 102 has a terminal connected to $V_{DD}$ and transistor 103 has a terminal connected to $V_{SS}$, or ground. The gate, or input, of transistor 102 is connected to the data signal 92 and the gate, or input, of transistor 103 is connected to a data input 71 from driver/buffer 72. When the data signal 92 is 'low' and the data input 71 transitions from a 'low' to a 'high,' transistor 102 is initially 'off' and transistor 103 switches 'on' due to the switching of the data input 71 from 'low' to 'high,' which, in turn, pulls down the terminal 105 connected to the gate of the normally connected pull-up transistor 80 to $V_{SS}$. This, in turn, switches the normally connected pull-up transistor 80 'on,' and the data signal 92 begins to switch from 'low' to 'high' as it gets connected to $V_{DD}$ through the 'on' transistor 80. As the voltage of the data signal 92 rises, transistor 102, which has its gate connected to the data signal 92, switches 'on,' thereby forming a voltage potential divider at the gate of the normally connected pull-up transistor 80. Because both transistors 102 and 103 are 'on,' the voltage at the gate of the normally connected pull-up transistor 80 rises from $V_{SS}$ to a higher value that depends on the sizes of transistors 102 and 103. This raising of the voltage at the gate of the normally connected pull-up transistor 80 reduces the drive strength of the normally connected pull-up transistor 80. Such reduction in drive strength leads to reduced current as the voltage on the data signal 92 rises, thereby further linearizing the I-V behavior of the driver stage.

Figure 6:
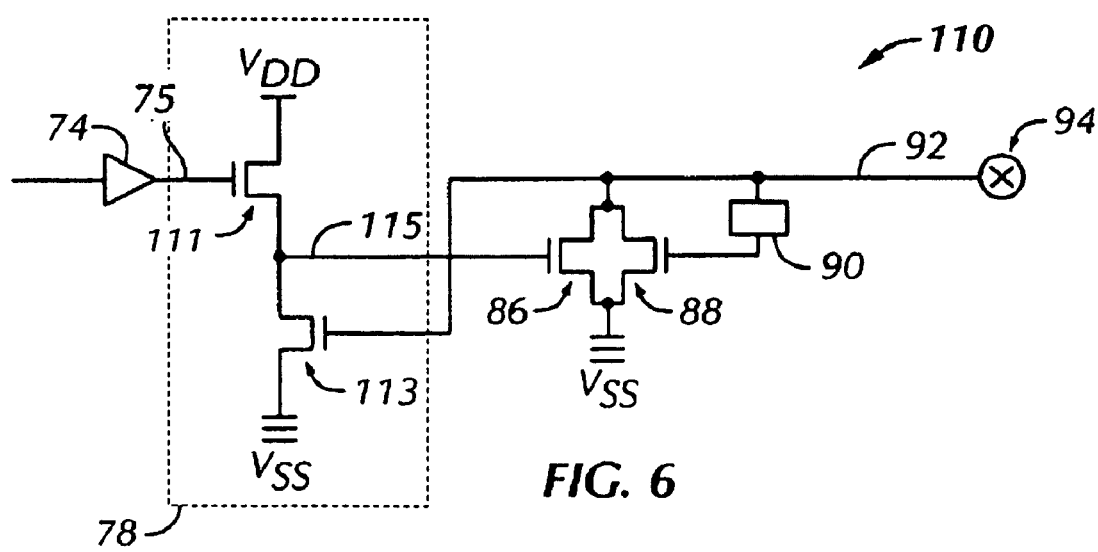
FIG. 6 shows a portion of a driver stage of the chip-to-chip communication system shown in FIG. 4.

FIG. 6 shows an exemplary pull-down stage 110 of the driver stage of the portion of the chip-to-chip communication system 70 shown in FIG. 4. The pull-down stage 110 includes transistor 111 and transistor 113, which are connected in series at a terminal 115 that is connected to the gate of normally connected pull-down transistor 86. Transistor 111 has a terminal connected to $V_{DD}$ and transistor 113 has a terminal connected to $V_{SS}$, or ground. The gate, or input, of transistor 113 is connected to the data signal 92 and the gate, or input, of transistor 111 is connected to a data input 75 from driver/buffer 74. When the data signal 92 is 'high' and the data input 75 transitions from a 'high' to a 'low,' transistor 113 is initially 'off' and transistor 111 switches 'on' due to the switching of the data input 75 from 'high' to 'low,' which, in turn, pulls up the terminal 115 connected to the gate of the normally connected pull-down transistor 86 to $V_{DD}$. This, in turn, switches the normally connected pull-up transistor 86 'on,' and the data signal 92 begins to switch from 'high' to 'low.' As the voltage of the data signal 92 falls, transistor 113, which has its gate connected to the data signal 92, switches 'on,' thereby forming a voltage potential divider at the gate of the normally connected pull-down transistor 86. Because both transistors 111 and 113 are 'on,' the voltage at the gate of the normally connected pull-down transistor 86 falls from $V_{DD}$ to a lower value that depends on the sizes of transistors 111 and 111. This lowering of the voltage at the gate of the normally connected pull-down transistor 86 reduces the drive strength of the normally connected pull-down transistor 86. Such reduction in drive strength leads to reduced current as the voltage on the data signal 92 rises, thereby further linearizing the I-V behavior of the driver stage.

Those skilled in the art will understand that the circuitry described with reference to FIGS. 4, 5, and 6 may also be used for and implemented in chip termination circuitry.

Advantages of the present invention may include one or more of the following. In one or more embodiments, because the I-V behavior of a signal driving driver stage in a chip-to-chip communication system is substantially linear, the output impedance of the driver stage may be substantially constant.

In one or more embodiments, because the I-V behavior of a signal in a chip-to-chip communication system is substantially linear, the impedance at an input termination may be substantially constant.

In one or more embodiments, because the I-V behavior of a signal driving driver stage in a chip-to-chip communication system is substantially linear across a transition of a data signal driven by the driver stage, the signal integrity of the data signal may be improved.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A communication system, comprising:
   a pull-up driver portion arranged to generate a first transition on a data signal, the pull-up driver portion comprising:
      at least one pull-up device operatively connected to the data signal, and pull-up control circuitry arranged to modulate a drive strength of the pull-up device dependent on a feedback of the data signal to the pull-up control circuitry; and
   a pull-down driver portion arranged to generate a second transition on the data signal, the pull-down driver portion comprising:
      at least one pull-down device operatively connected to the data signal, and
      pull-down control circuitry arranged to modulate a drive strength of the pull-down device dependent on a feedback of the data signal to the pull-down control circuitry,
   wherein at least one of:
      the pull-up control circuitry is arranged to form a voltage potential divider at an input to the pull-up device dependent on the first transition; and
      the pull-down control circuitry is arranged to form a voltage potential divider at an input to the pull-down device dependent on the second transition.

2. The communication system of claim 1, wherein the pull-up driver portion and the pull-down driver portion are arranged to receive input data.

3. The communication system of claim 1, wherein the first transition is a low to high transition.

4. The communication system of claim 1, wherein the second transition is a high to low transition.

5. The communication system of claim 1, further comprising a data channel arranged to propagate the data signal to a receiver circuit.

6. A communication system, comprising:
   a pull-up driver portion arranged to generate a first transition on a data signal, the pull-up driver portion comprising:
      at least one pull-up device operatively connected to the data signal, and
      pull-up control circuitry arranged to modulate a drive strength of the pull-up device dependent on a feedback of the data signal to the pull-up control circuitry; and
   a pull-down driver portion arranged to generate a second transition on the data signal, the pull-down driver portion comprising:
      at least one pull-down device operatively connected to the data signal, and
      pull-down control circuitry arranged to modulate a drive strength of the pull-down device dependent on a feedback of the data signal to the pull-down control circuitry, wherein at least one of:
  the pull-up driver portion further comprises a diode-connected pull-up device arranged to compensate for current through the pull-up device during a portion of the first transition; and
  the pull-down driver portion further comprises a diode-connected pull-down device arranged to compensate for current through the pull-down device during a portion of the second transition.

7. A method for handling a data signal, comprising:
receiving data;
establishing a voltage divider potential dependent on the data signal and the data;
when the data represents a logic high, pulling up a voltage of the data signal, wherein the pulling up comprises:
  feeding back the data signal, and
  modulating the pulling up dependent on the feeding back; and
when the data represents a logic low, pulling down the voltage of the data signal, wherein the pulling down comprises:
  feeding back the data signal, and
  modulating the pulling down dependent on the feeding back.

8. The method of claim 7, wherein the pulling up further comprises supplementarily sourcing current to the data signal dependent on a voltage of the data signal.

9. The method of claim 7, wherein the pulling down further comprises supplementarily sinking current from the data signal dependent on a voltage of the data signal.

10. The method of claim 7, further comprising:
propagating the data signal; and
receiving the data signal.

11. The method of claim 7, wherein the modulating the pulling up is also dependent on the voltage divider potential.

12. The method of claim 7, wherein the modulating the pulling down is also dependent on the voltage divider potential.

13. A communication system, comprising:
means for receiving input data;
means for pulling up a voltage of a data signal when the input data is a logic high, wherein the means for pulling up comprises:
  first control means for controlling a drive strength of the means for pulling up dependent on a feedback of the data signal to the first control means; and
means for pulling down the voltage of the data signal when the input data is a logic low, wherein the means for pulling down comprises:
  second control means for controlling a drive strength of the means for pulling down dependent on a feedback of the data signal to the second control means.
where in at least one of:
  the first control means comprises means for establishing a voltage divider potential dependent on the data signal and the input data, wherein the drive strength of the means for pulling up is dependent on the voltage divider potential; and
  the second control means comprises means for establishing a voltage divider potential dependent on the data signal and the input data, wherein the drive strength of the means for pulling down is dependent on the voltage divider potential.

* * * * *